United States Patent
Chen et al.

(10) Patent No.: US 10,662,001 B2
(45) Date of Patent: May 26, 2020

(54) FEEDER SYSTEM

(71) Applicants: BOE Technology Group Co., Ltd., Beijing (CN); HEFEI XINSHENG OPTOELECTRONICS TECHNOLOGY CO., LTD, Hefei (CN)

(72) Inventors: Guangfei Chen, Beijing (CN); Dagang Liu, Beijing (CN)

(73) Assignees: BOE TECHNOLOGY GROUP CO., LTD., Beijing (CN); HEFEI XINSHENG OPTOELECTRONICS TECHNOLOGY CO., LTD., Heifei (CN)

( * ) Notice: Subject to any disclaimer, the term of this patent is extended or adjusted under 35 U.S.C. 154(b) by 12 days.

(21) Appl. No.: 16/112,605

(22) Filed: Aug. 24, 2018

(65) Prior Publication Data

US 2019/0270600 A1    Sep. 5, 2019

(30) Foreign Application Priority Data

Mar. 1, 2018  (CN) .................... 2018 2 0289052 U (51) Int. Cl.
*B65G 47/90* (2006.01)
*B65G 47/96* (2006.01)

(52) U.S. Cl.
CPC ......... *B65G 47/904* (2013.01); *B65G 47/905* (2013.01); *B65G 2201/0235* (2013.01)

(58) Field of Classification Search
CPC .... B65G 47/904; B65G 47/905; B65G 47/90; B65G 47/96

USPC ...... 198/572, 803.3; 414/758, 759, 761, 763
See application file for complete search history.

(56) References Cited

U.S. PATENT DOCUMENTS

| | | | | |
|---|---|---|---|---|
| 4,305,692 A * | 12/1981 | Brauer | ................... | B22D 33/00 164/137 |
| 4,854,442 A * | 8/1989 | Krooss | ................... | B65G 47/24 198/400 |
| 5,009,565 A * | 4/1991 | Esau | ....................... | B66F 9/187 294/206 |
| 5,484,251 A * | 1/1996 | Sanda | .................. | B65G 47/252 294/119.1 |
| 6,874,515 B2 * | 4/2005 | Ishihara | .................... | B08B 1/04 134/140 |
| 6,918,735 B2 * | 7/2005 | Urban | ............... | H01L 21/68707 294/106 |
| 7,695,240 B2 * | 4/2010 | Ghosh | .................. | B65G 57/183 198/403 |
| 7,926,441 B2 * | 4/2011 | Tsutsumi | .......... | H01L 21/67051 118/300 |
| 8,573,918 B2 * | 11/2013 | Lawson | ............... | B25J 15/0028 157/16 |

(Continued)

*Primary Examiner* — Douglas A Hess
(74) *Attorney, Agent, or Firm* — McDermott Will & Emery LLP (57) ABSTRACT

Embodiments of the present disclosure provide a feeder system. The feeder system includes a rotary device configured to grip a container containing a material; and a controller electrically connected to the rotary device and configured to send a first rotation instruction to the rotary device so that the rotary device rotates the container. The rotary device is configured to rotate by a predetermined angle in response to the first rotation instruction sent by the controller, so that the material in the container is poured.

20 Claims, 2 Drawing Sheets

(56) References Cited

U.S. PATENT DOCUMENTS

| | | | | |
|---|---|---|---|---|
| 9,099,510 B2* | 8/2015 | Todorov | ............ | H01L 21/67718 |
| 9,457,963 B2* | 10/2016 | Yang | ...................... | B65G 47/22 |
| 9,662,793 B1* | 5/2017 | Min | ..................... | B25J 15/0014 |
| 9,701,503 B2* | 7/2017 | Yamada | ................. | B65H 31/34 |

* cited by examiner

FEEDER SYSTEM

CROSS-REFERENCE TO RELATED APPLICATION(S)

This application claims priority to Chinese Patent Application No. 201820289052.9, filed on Mar. 1, 2018, entitled "FEEDER SYSTEM," which is incorporated herein by reference in its entirety.

TECHNICAL FIELD

Embodiments of the present disclosure relate to a feeder system.

BACKGROUND

In the field of display technology, when a display device such as a display panel, a touch screen and the like is manufactured, generally a printing operation is carried out with ink by means of a screen printing apparatus to manufacture a required structure on a substrate. Usually, an ink tank is used to contain the ink.

SUMMARY

Embodiments of the present disclosure provide a feeder system, comprising: a rotary device configured to grip a container containing a material; and a controller electrically connected to the rotary device and configured to send a first rotation instruction to the rotary device so that the rotary device rotates the container, wherein the rotary device is configured to rotate by a predetermined angle in response to the first rotation instruction sent by the controller, so that the material in the container is poured.

According to embodiments of the present disclosure, the rotary device comprises: a grip assembly configured to grip the container; and a rotary assembly to which the grip assembly is connected and which is configured to rotate the grip assembly.

According to embodiments of the present disclosure, the rotary assembly comprises a rotary disk to which the grip assembly is connected.

According to embodiments of the present disclosure, the rotary assembly further comprises: a transmission shaft connected with the rotary disk; and a motor connected with the transmission shaft.

According to embodiments of the present disclosure, the grip assembly comprises two grip parts each comprising: a pull member having a first end and a second end; a pincer having a first end connected with the second end of the pull member, and a second end; a gripping member connected to the second end of the pincer; and a hinge connected to a middle portion of the pincer.

According to embodiments of the present disclosure, the grip assembly further comprises an actuator respectively connected to the first ends of the pull members of the two grip parts to apply pulling forces to the first ends of the pull members, so that the pincers are rotated about axes of rotation of the hinges by the second ends of the pull members of the two grip parts, thereby to grip the container through the gripping members.

According to embodiments of the present disclosure, the grip assembly comprises: a first gripper formed with a first left-hand threaded hole; a second gripper formed with a second right-hand threaded hole; a slide rail along which the first gripper and the second gripper are movable; and a driving screw having a first left-hand threaded segment engaged in the first left-hand threaded hole of the first gripper, and a second right-hand threaded segment engaged in the second right-hand threaded hole of the second gripper.

According to embodiments of the present disclosure, the grip assembly further comprises: a first gripping jaw fixed to the first gripper; and a second gripping jaw fixed to the second gripper.

According to embodiments of the present disclosure, the rotary device further comprises a carrying member fixedly connected to the rotary assembly and configured to support the container.

According to embodiments of the present disclosure, the feeder system further comprises: a lid opening device configured to open a lid of the container and comprising: an opener configured to be attached to the lid of the container; and an actuator connected with the opener and configured to move the opener in a direction away from the container so that the lid of the container is opened.

According to embodiments of the present disclosure, the rotary device further comprises a weight sensor electrically connected to the controller and configured to detect a weight of the material contained in the container; and the controller is further configured to determine, based on the weight detected by the weight sensor, the predetermined angle by which the rotary device needs to rotate, and control the rotary device to rotate by the predetermined angle in a vertical plane.

According to embodiments of the present disclosure, the feeder system further comprises: a conveyer electrically connected to the controller and configured to convey the container containing the material from a first station to a second station in response to a first movement instruction sent by the controller; a transfer device electrically connected to the controller, and configured to transfer the container from the second station to a third station in response to a second movement instruction sent by the controller, thereby to transfer the container to the rotary device; and a moving device which is electrically connected to the controller, to which the rotary device is connected such that the rotary device is moved by the moving device, and wherein the moving device is configured to move, in response to a third movement instruction sent by the controller, the rotary device carrying the container from the third station to a fourth station so that the rotary device rotates by the predetermined angle in the fourth station to pour the material contained in the container; or wherein the moving device is configured such that, in response to the third movement instruction sent by the controller, the moving device moves the rotary device from the fourth station to the third station so that the container is fixed to the rotary device, and then the moving device moves the rotary device from the third station to the fourth station so that the rotary device rotates by the predetermined angle in the fourth station to pour the material contained in the container.

According to embodiments of the present disclosure, the conveyer comprises: an endless belt; a driving pulley configured to move the endless belt; and a pressing force sensor configured to detect a pressing force received by the belt in the second station; and the controller is further configured to determine that the container has been conveyed to the second station when the pressing force detected by the pressing force sensor is greater than a preset pressing force, and control the driving pulley to stop.

According to embodiments of the present disclosure, the transfer device comprises: a transfer assembly; and a grip assembly connected to the transfer assembly and configured to grip the container; each of the transfer assembly and the grip assembly is electrically connected to the controller; the grip assembly is configured to grip the container in response to the second movement instruction sent by the controller; and the transfer assembly is configured to move, in response to the second movement instruction sent by the controller, the grip assembly gripping the container to transfer the container from the second station to the third station.

According to embodiments of the present disclosure, the grip assembly comprises: a first gripper formed with a first left-hand threaded hole; a second gripper formed with a second right-hand threaded hole; a slide rail along which the first gripper and the second gripper are movable; and a driving screw having a first left-hand threaded segment engaged in the first left-hand threaded hole of the first gripper, and a second right-hand threaded segment engaged in the second right-hand threaded hole of the second gripper.

According to embodiments of the present disclosure, the grip assembly further comprises: a first gripping jaw fixed to the first gripper; and a second gripping jaw fixed to the second gripper.

According to embodiments of the present disclosure, the grip assembly further comprises: a motor which has an output shaft coupled with the driving screw.

According to embodiments of the present disclosure, the transfer assembly comprises: a moving assembly to which the grip assembly is connected; and an elevating assembly connected with the moving assembly and configured to raise the container after the grip assembly grips the container and to lower the container before the grip assembly releases the container.

According to embodiments of the present disclosure, the pull member is a pull rope.

According to embodiments of the present disclosure, the moving device is further configured to move, in response to a fourth movement instruction sent by the controller, the rotary device from the fourth station to a fifth station; and the rotary device is further configured to rotate in response to a second rotation instruction sent by the controller and release the container into a container recovery region, in the fifth station.

DETAILED DESCRIPTION

In order that the objects, advantages, and features of the present disclosure become more apparent and are more readily appreciated, a further description of the present disclosure will be made as below with reference to embodiments of the present disclosure taken in conjunction with the accompanying drawings.

A further description of the present disclosure will be made in detail as below with reference to embodiments taken in conjunction with the accompanying drawings. The following embodiments are intended to explain the present disclosure and the present disclosure should not be construed as being limited to the embodiments set forth herein.

Figure 1:
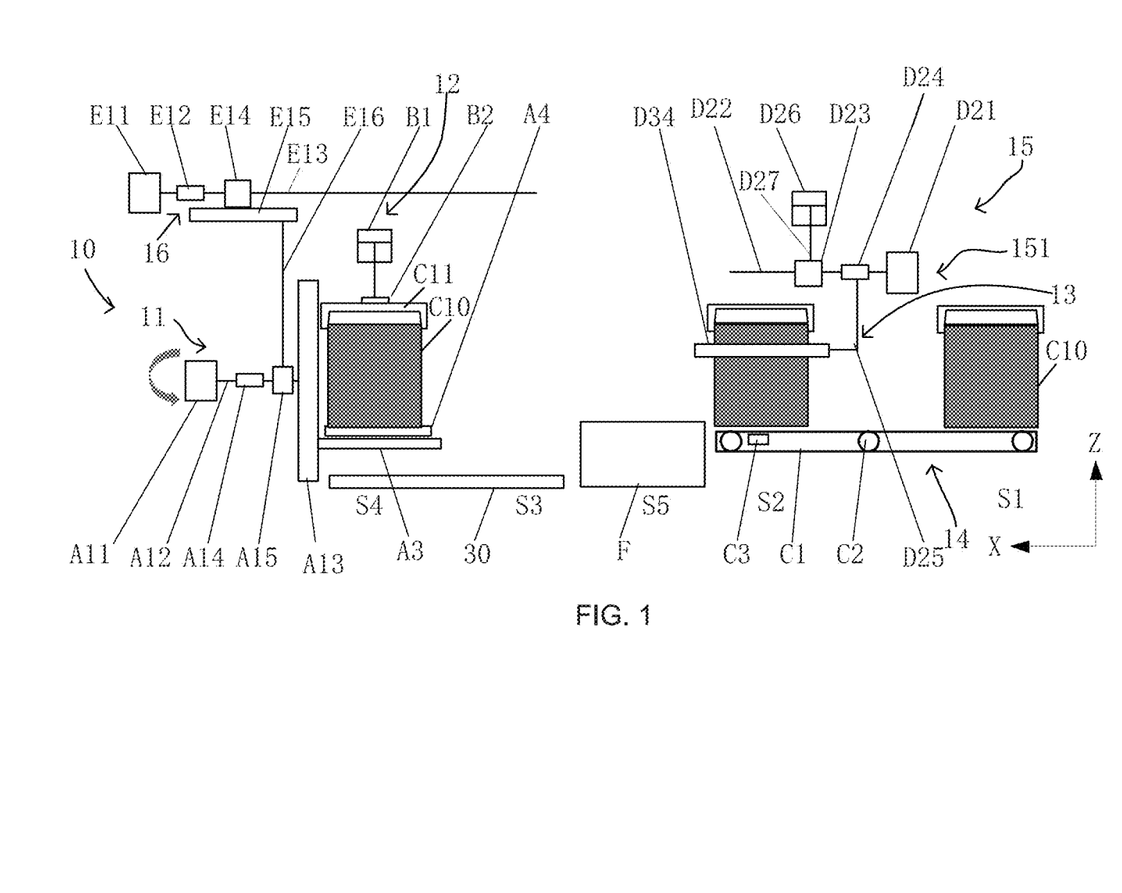
FIG. 1 is a schematic diagram showing a configuration of a feeder system according to various embodiments of the present disclosure.
Figure 2:
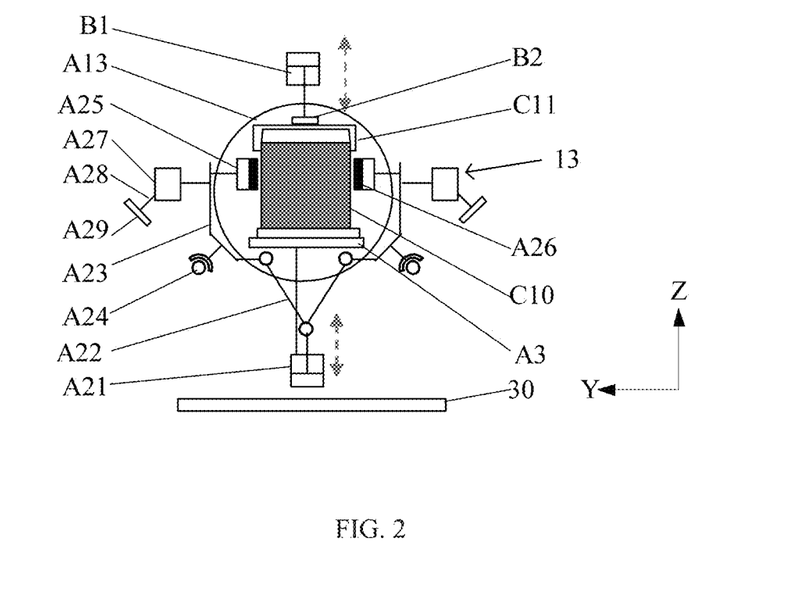
FIG. 2 is a schematic diagram showing a configuration of a grip assembly of the feeder system according to various embodiments of the present disclosure.
Figure 3:
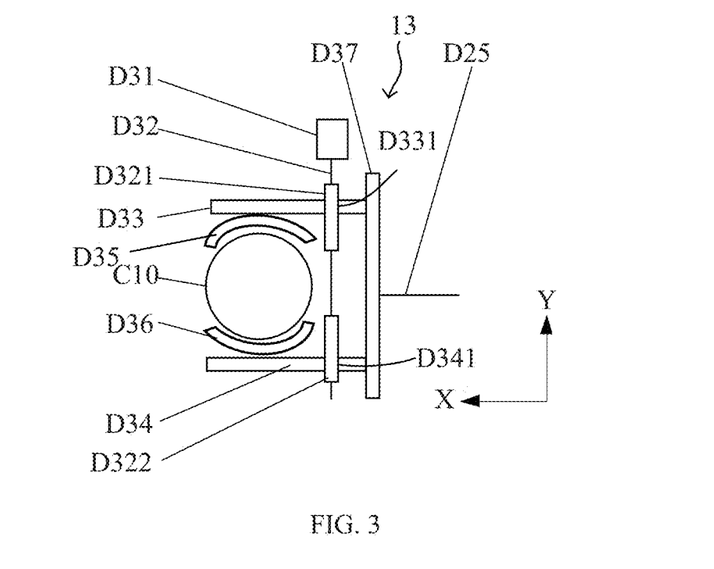
FIG. 3 is a schematic diagram showing a configuration of another grip assembly of the feeder system according to various embodiments of the present disclosure.

Embodiments of the present disclosure provide a feeder system. Referring to FIG. 1 to FIG. 3, the feeder system according to various embodiments of the present disclosure includes: a rotary device 10 configured to grip a container C10 containing a material; and a controller 40 electrically connected to the rotary device 10 and configured to send a first rotation instruction to the rotary device 10 so that the rotary device 10 rotates the container C10. The rotary device 10 is configured to rotate by a predetermined angle in response to the first rotation instruction sent by the controller 40, so that the material in the container C10 is poured.

With provision of the rotary device 10 and the controller 40, the feeder system can mechanizedly pour the material contained in the container C10. Such a mechanized operation consumes less time and has higher operational efficiency. When screen printing is carried out with the feeder system according to various embodiments of the present disclosure, printing time is shortened, working amount of workers is decreased, a waste of the ink is avoided, and environmental safety is guaranteed since whole ink feeding operation is mechanizedly done by the feeder system.

A size of the predetermined angle and a direction of the rotation of the rotary device 10 in response to the first rotation instruction sent by the controller 40 may be set according to actual conditions. For example, the rotary device 10 rotates by 180 degrees in a vertical plane. Furthermore, the predetermined angle may be any other appropriate angle.

According to embodiments of the present disclosure, referring to FIG. 1 and FIG. 2, the rotary device 10 includes: a grip assembly 13 configured to grip the container C10; and a rotary assembly 11 to which the grip assembly 13 is connected and which is configured to rotate the grip assembly 13.

According to embodiments of the present disclosure, referring to FIG. 1 and FIG. 2, the rotary assembly 11 includes a rotary disk A13 to which the grip assembly 13 is connected.

Referring to FIG. 1 and FIG. 2, according to embodiments of the present disclosure, the rotary assembly 11 further includes: a transmission shaft A12 connected with the rotary disk A13; and a motor A11 connected with the transmission shaft A12. Referring to FIG. 1 and FIG. 2, according to embodiments of the present disclosure, the grip assembly 13 includes two grip parts each including: a pull member A22 having a first end and a second end; a pincer A23 having a first end connected with the second end of the pull member A22, and a second end; a gripping member A25 connected to the second end of the pincer A23; and a hinge A24 connected to a middle portion of the pincer A23. The grip assembly 13 further includes an actuator A21 respectively connected to the first ends of the pull members A22 of the two grip parts to apply pulling forces to the first ends of the pull members A22, so that the pincers A23 are rotated about axes of rotation of the hinges A24 by the second ends of the pull members A22 of the two grip parts, thereby to grip the container C10 through the gripping members A25.

For example, in the embodiments as shown in FIG. 1, the feeder system includes a rotary device 10. A rotary assembly 11 of the rotary device 10 may include a motor A11, a transmission shaft A12 and a rotary disk A13. The motor A11 is connected to the rotary disk A13 through the transmission shaft A12, and a grip assembly 13 is fixedly connected to the rotary disk A13. In operation, when the motor A11 is rotated, it drives the transmission shaft A12 to rotate so that the transmission shaft A12 rotates the rotary disk A13. The grip assembly 13 is fixedly connected to the rotary disk A13, and the grip assembly 13 is configured to grip the container C10. Therefore, the rotary disk A13 in turn rotates the container C10, so that a material in the container C10 is poured onto an object 30. As shown in FIG. 1, specifically, the rotary assembly 11 may further include a coupling A14 and a speed reducer A15.

For example, in the embodiment as shown in FIG. 2, the grip assembly 13 may include an actuator A21 and two grip parts. Each of the two grip parts includes a pull member A22 such as a pull rope or a pull rod, a pincer A23, a hinge A24, and a gripping member A25. In each of the two grip parts, a first end of the pull member A22 is connected with the actuator A21, and a second end of the pull member A22 is connected with a first end of the pincer A23; a second end of the pincer A23 is connected with the gripping member A25, a middle portion of the pincer A23 is connected with the hinge A24, and the pincer A23 is rotatable about an axis of rotation of the hinge A24; and the gripping member A25 is configured to grip the container C10. The actuator A21 is configured to apply pulling forces to the first ends of the pull members A22 of the two grip parts, respectively, so that the pincers A23 are rotated about axes of rotation of the hinges A24 by the second ends of the pull members A22 of the two grip parts, thereby to grip the container C10 through the gripping members A25. As a result, the grip assembly 13 grips the container C10. The actuator A21 is further configured to remove, by a preset operation such as a movement towards the container, the pulling forces applied to the pull members A22 of the two grip parts, so that the gripping members A25 of the two grip parts move away from the container C10. As a result, the grip assembly 13 releases the container C10. Directions indicated by an arrow on a lower side in FIG. 2 denote directions in which the pull members A22 are moved by the actuator A21.

The actuator A21 may include any appropriate actuators such as a driving screw and a step motor, a cylinder or the like. A nonslip piece A26 may be disposed on the gripping member A25 to increase a frictional force between the gripping member A25 and the container C10, thereby improving an effect of gripping the container C10 by the grip assembly 13.

According to various embodiments of the present disclosure, as shown in FIG. 2, the grip assembly 13 may further include: a balance weight A27, a spring A28 and a position limit member A29. The balance weight A27 is fixed to the pincer A23 on a side of the pincer A23 opposite to the gripping member A25, and the balance weight A27 is connected with the position limit member A29 through the spring A28. The position limit member A29 may be fixed to limit a movement of the balance weight A27 and thus an angle of rotation of the pincer A23. When the actuator A21 removes the pulling force applied to the pull member A22, the balance weight A27 rotates the pincer A23 about the axis of rotation of the hinge A24 under the action of gravity of the balance weight A27 and thereby the pincer A23 moves the gripping member A25 in a direction away from the container C10. As a result, the grip assembly 13 releases the container C10.

Structures and sizes of components of the grip assembly 13 shown in FIG. 2 may be set according to actual situations, and there is no limitation on the structures and the sizes of the components of the grip assembly 13 in various embodiments of the present disclosure.

Referring to FIG. 1 and FIG. 3, according to various embodiments of the present disclosure, the grip assembly 13 includes: a first gripper D33 formed with a first left-hand threaded hole D331; a second gripper D34 formed with a second right-hand threaded hole D341; a slide rail D37 along which the first gripper D33 and the second gripper D34 are movable; and a driving screw D32 having a first left-hand threaded segment D321 engaged in the first left-hand threaded hole D331 of the first gripper D33, and a second right-hand threaded segment D322 engaged in the second right-hand threaded hole D341 of the second gripper D34.

Referring to FIG. 1 and FIG. 3, according to embodiments of the present disclosure, the grip assembly 13 further includes a first gripping jaw D35 fixed to the first gripper D33; and a second gripping jaw D36 fixed to the second gripper D34.

For example, in the embodiments shown in FIG. 3, the grip assembly 13 may further include a manipulator configured to grip the container C10 when receiving the first rotation instruction sent by the controller 40. The manipulator may be specifically configured according to actual situations. For example, as shown in FIG. 3, the grip assembly 13 includes a manipulator. The manipulator includes: a motor D31, a driving screw D32, a first gripper D33, a second gripper D34, a first gripping jaw D35, a second gripping jaw D36, and a slide rail D37. The first gripping jaw D35 is fixed to the first gripper D33, and the first gripper D33 is formed with a first left-hand threaded hole D331 having a first internal thread. The second gripping jaw D36 is fixed to the second gripper D34, and the second gripper D34 is formed with a second right-hand threaded hole D341 having a second internal thread. The first gripper D33 is guided by the slide rail D37, and is movable along the slide rail D37, and the second gripper D34 is guided by the slide rail D37, and is movable along the slide rail D37. The driving screw D32 is connected with the motor D31, and is provided, on both ends, with a first left-hand threaded segment D321 and a second right-hand threaded segment D322. The driving screw D32 is fitted in both the first left-hand threaded hole D331 of the first gripper D33 and the second right-hand threaded hole D341 of the second gripper D34. The driving screw D32 and the first gripper D33 constitute a first kinematic pair by means of the first left-hand threaded segment D321 and the first left-hand threaded hole D331, and the driving screw D32 and the second gripper D34 constitute a second kinematic pair by means of the second right-hand threaded segment D322 and the second right-hand threaded hole D341.

Referring to FIG. 1 and FIG. 3, when the motor D31 is rotated in a first direction, the motor D31 drives the driving screw D32 to rotate in the first direction. The first gripper D33 and the second gripper D34 approach each other so that the first gripping jaw D35 and the second gripping jaw D36 grip the container C10. When the motor D31 is rotated in a second direction opposite to the first direction, the motor D31 drives the driving screw D32 to rotate in the second direction. The first gripper D33 and the second gripper D34 move away from each other so that the first gripping jaw D35 and the second gripping jaw D36 release the container C10.

Referring to FIG. 1 and FIG. 3, the manipulator may further include an arm D25 configured to fix the manipulator to another component.

Referring to FIG. 1 and FIG. 3, nonslip layers may be disposed on surfaces of the first gripping jaw D35 and the second gripping jaw D36, respectively, or nonslip structures such as nonslip ridges may be formed on the surfaces of the first gripping jaw D35 and the second gripping jaw D36, respectively, so as to increase a frictional force between the gripping jaws and the container, thereby improving an effect of gripping the container C10 by the gripping jaws. The gripping jaws may be made of material having a relatively great coefficient of elasticity. For example, shapes of the gripping jaws match a shape of a wall of the container C10, so that the gripping jaws closely grip the container C10. Structures and sizes of components such as the gripping jaws in the grip assembly 13 may be set according to actual situations, and there is no limitation on the structures and the sizes of the components such as the gripping jaws in the grip assembly 13 in various embodiments of the present disclosure.

Referring to FIG. 1 and FIG. 2, according to embodiments of the present disclosure, the rotary device 10 further includes a carrying member A3 fixedly connected to the rotary assembly 11 and configured to support the container C10.

Referring to FIG. 1 and FIG. 2, according to embodiments of the present disclosure, the carrying member A3 is configured to carry the container C10 during the rotation of the rotary assembly 11. As shown in FIG. 1, the rotary device 10 further includes a carrying member A3 fixed to a rotary disk A13 of the rotary assembly 11 such that when the rotary disk A13 is rotated, the rotary disk A13 rotates the carrying member A3. For example, when the rotary disk A13 is rotated in a vertical plane, the rotary disk A13 rotates the carrying member A3. The carrying member A3 may be any other appropriate structure than a carrying stage shown in FIG. 1, for achieving the function of the carrying member A3, and there is no limitation on the structure of the carrying member A3 in various embodiments of the present disclosure.

Referring to FIG. 1 and FIG. 3, according to embodiments of the present disclosure, the rotary device 10 further includes a weight sensor A4 electrically connected to the controller 40 and configured to detect a weight of the material contained in the container C10; and the controller 40 is further configured to determine, based on the weight detected by the weight sensor A4, the predetermined angle by which the rotary device 10 needs to rotate, and control the rotary device 10 to rotate by the predetermined angle in a vertical plane.

As shown in FIG. 1, the rotary device 10 further includes a weight sensor A4 disposed on the carrying member A3 of the rotary device 10. The weight sensor A4 is disposed such that the controller 40 can accurately determine a weight of remaining material contained in the container, based on the weight detected by the weight sensor A4. By determining the predetermined angle by which the rotary device needs to rotate, the material contained in the container is accurately poured, thereby improving accuracy of operation of the feeder system.

Referring to FIG. 1 and FIG. 2, according to embodiments of the present disclosure, the feeder system further includes: a lid opening device 12 configured to open a lid C11 of the container C10. The lid opening device 12 includes: an opener B2 configured to be attached to the lid C11 of the container C10; and an actuator B1 connected with the opener B2 and configured to move the opener B2 in a direction away from the container C10 so that the lid C11 of the container C10 is opened.

For example, in the embodiments as shown in FIG. 1, the feeder system further includes a lid opening device 12. The lid opening device 12 may include: an actuator B1 and an opener B2. The opener B2 may include an electromagnet and other components. The lid C11 of the container C10 is provided with a metal structure. The actuator B1 is configured to move the opener B2 towards the lid C11 of the container C10 in response to an actuation instruction sent by the controller 40; and move the opener B2 away from the container C10 when the opener B2 is attached to the metal structure of the lid C11 of the container C10 by means of attraction. The opener B2 is configured such that when the opener is moved to the lid C11 of the container C10, the electromagnet is energized so that the electromagnet is attached to the metal structure of the lid C11 of the container C10 by means of attraction; and after the electromagnet is attached to the metal structure, the actuator B1 moves the opener B2 away from the container C10 to open the lid C11 of the container C10. The controller 40 deenergizes the electromagnet so that the electromagnet releases the lid C11 of the container C10.

In fact, the opener B2 and the actuator B1 can operate in various ways. For example, after the electromagnet of the opener B2 is attached to the metal structure of the lid C11 of the container C10 by means of attraction, the opener B2 sends an instruction signal to the actuator B1. After the actuator B1 receives the instruction signal sent by the opener B2, it moves the electromagnet of the opener B2 away from the container C10 to open the lid C11 of the container C10. Alternatively, after a preset period of time since the actuator B1 begins to move the electromagnet of the opener B2 towards the lid C11 of the container, the actuator B1 moves the electromagnet of the opener B2 away from the container C10 on its own initiative, so that the lid C11 of the container C10 carried by the electromagnet of the opener B2 moves away from the container. The above operational ways of the opener B2 and the actuator B1 are only examples, and operational ways of the opener B2 and the actuator B1 may be set according to actual conditions.

The actuator B1 can move the electromagnet of the opener B2 towards and away from the container C10. The actuator B1 may be configured in various ways. For example, the actuator B1 may include a cylinder, of which a piston rod is connected to the electromagnet of the opener B2, or a driving screw and a step motor. There is no limitation on the specific configuration of the actuator B1 in various embodiments of the present disclosure.

The opener B2 may include any other member such as a hook or a snap than the electromagnet, for achieving the function of the lid opening device. The other member such as the hook or the snap is used to indirectly connect the actuator B1 with the lid C11 of the container C10, so that the actuator B1 moves the opener B2 to open or close the lid C11 of the container C10.

Referring to FIG. 1, according to embodiments of the present disclosure, the feeder system further includes: a conveyer 14 electrically connected to the controller 40 and configured to convey the container C10 containing the material from a first station S1 to a second station S2 in response to a first movement instruction sent by the controller 40; a transfer device 15 electrically connected to the controller 40, and configured to transfer the container C10 from the second station S2 to a third station S3 in response to a second movement instruction sent by the controller 40, thereby to transfer the container C10 to the rotary device 10; and a moving device 16 which is electrically connected to the controller 40, and to which the rotary device 10 is connected such that the rotary device 10 is moved by the moving device 16. The moving device 16 is configured to move, in response to a third movement instruction sent by the controller 40, the rotary device 10 carrying the container C10 from the third station S3 to a fourth station S4 so that the rotary device 10 rotates by the predetermined angle in the fourth station S4 to pour the material contained in the container C10; or the moving device 16 is configured such that, in response to the third movement instruction sent by the controller 40, the moving device 16 moves the rotary device 10 from the fourth station S4 to the third station S3 so that the container C10 is fixed to the rotary device 10, and then the moving device 16 moves the rotary device 10 from the third station S3 to the fourth station S4 so that the rotary device 10 rotates by the predetermined angle in the fourth station S4 to pour the material contained in the container C10.

Referring to FIG. 1, according to embodiments of the present disclosure, the conveyer 14 includes: an endless belt C1; a driving pulley C2 configured to drive the endless belt C1 to move; and a pressing force sensor C3 configured to detect a pressing force received by the belt C2 in the second station S2; and the controller 40 is further configured to determine that the container C10 has been conveyed to the second station S2 when the pressing force detected by the pressing force sensor C3 is greater than a preset pressing force, and control the driving pulley C2 to stop.

Referring to FIG. 1 and FIG. 3, according to embodiments of the present disclosure, the transfer device 15 includes: a transfer assembly 151; and a grip assembly 13 connected to the transfer assembly 151 and configured to grip the container C10. Each of the transfer assembly 151 and the grip assembly 13 is electrically connected to the controller 40; the grip assembly 13 is configured to grip the container C10 in response to the second movement instruction sent by the controller 40; and the transfer assembly 151 is configured to move, in response to the second movement instruction sent by the controller 40, the grip assembly 13 gripping the container C10 to transfer the container C10 from the second station S2 to the third station S3.

Referring to FIG. 1 and FIG. 3, according to embodiments of the present disclosure, the grip assembly 13 includes: a first gripper D33 formed with a first left-hand threaded hole D331; a second gripper D34 formed with a second right-hand threaded hole D341; a slide rail D37 along which the first gripper D33 and the second gripper D34 are movable; and a driving screw D32 having a first left-hand threaded segment D321 engaged in the first left-hand threaded hole D331 of the first gripper D33, and a second right-hand threaded segment D322 engaged in the second right-hand threaded hole D341 of the second gripper D34. According to embodiments of the present disclosure, the grip assembly 13 further includes a first gripping jaw D35 fixed to the first gripper D33; and a second gripping jaw D36 fixed to the second gripper D34.

Referring to FIG. 1 and FIG. 3, according to embodiments of the present disclosure, the grip assembly 13 further includes a motor 31 which has an output shaft coupled with the driving screw D32.

Referring to FIG. 1 and FIG. 3, according to embodiments of the present disclosure, the transfer assembly 151 includes: a moving assembly D24, D21 to which the grip assembly 13 is connected; and an elevating assembly 26 connected with the moving assembly D24, D21 and configured to raise the container C10 after the grip assembly 13 grips the container C10 and to lower the container C10 before the grip assembly 13 releases the container C10.

Referring to FIG. 1 and FIG. 2, according to embodiments of the present disclosure, the moving device 16 is further configured to move, in response to a fourth movement instruction sent by the controller 40, the rotary device 10 from the fourth station S4 to a fifth station S5; and the rotary device 10 is further configured to rotate in response to a second rotation instruction sent by the controller 40 and release the container C10 into a container recovery region F, in the fifth station S5.

Each of the conveyer 14, the transfer device 15, and the moving device 16 of the feeder system according to various embodiments of the present disclosure is electrically connected to the controller 40.

According to various embodiments of the present disclosure, as shown in FIG. 1, the conveyer 14 is configured to convey a container C10 containing a material from a first station S1 to a second station S2 in response to a first movement instruction sent by the controller 40; the transfer device 15 is configured to transfer the container C10 from the second station S2 to a third station S3, in response to a second movement instruction sent by the controller 40; the moving device 16 is configured such that, in response to a third movement instruction sent by the controller 40, the moving device 16 moves the rotary device 10 from a fourth station S4 to the third station S3 so that the container is fixed to the rotary device; and the rotary device 10 is configured such that, in response to a predetermined movement instruction sent by the controller 40, the rotary device 10 is moved from the third station S3 to the fourth station S4 and the rotary device 10 rotates by a predetermined angle in the fourth station S4 to pour the material contained in the container C10. In other words, if the moving device 16 is being located in the third station S3 when receiving the third movement instruction sent by the controller 40, the moving device 16 moves, in response to the third movement instruction sent by the controller 40, the rotary device 10 carrying the container C10 from the third station S3 to the fourth station S4, and the rotary device 10 rotates by the predetermined angle in the fourth station S4 to pour the material contained in the container C10. If the moving device 16 is being located in the fourth station S4 when receiving the third movement instruction sent by the controller 40, the moving device 16 moves, in response to the third movement instruction sent by the controller 40, the rotary device 10 from the fourth station S4 to the third station S3 so that the container C10 is fixed to the rotary device 10, and then the rotary device 10 moves from the third station S3 to the fourth station S4 in response to the predetermined movement instruction sent by the controller 40, and rotates by the predetermined angle in the fourth station S4 to pour the material contained in the container C10.

According to various embodiments of the present disclosure, as shown in FIG. 1, the first station S1 is a conveyance commencing station of the container C10 and the container C10 is conveyed from the first station S1; the second station S2 is a mount waiting station of the container C10 and the container C10 waits to be mounted to the rotary device 10 in the second station S2; the third station S3 is a mounting station and the container C10 is mounted to the rotary device 10 in the third station S3; and the fourth station S4 is a material pouring station, and in fourth station S4, the rotary device 10 rotates to pour the material contained in the container C10. Specific positions of the stations may be set according to actual conditions.

Specific configurations and sizes of the conveyer 14, the transfer device 15, and the moving device 16 may be set according to actual conditions.

According to various embodiments of the present disclosure, as shown in FIG. 1, the transfer device 15 may include: a transfer assembly 151; and a grip assembly 13 connected to the transfer assembly 151. Each of the transfer assembly 151 and the grip assembly 13 is electrically connected to the controller 40. The grip assembly 13 is configured to grip the container C10 in response to the second movement instruction sent by the controller 40. The transfer assembly 151 is configured to move the grip assembly 13 gripping the container C10 from the second station S2 to the third station S3 in response to the second movement instruction sent by the controller 40.

The grip assembly 13 of the transfer device 15 is configured to grip the container C10, and may have various configurations. FIG. 2 and FIG. 3 show configurations of the grip assembly 13. The grip assembly 13 may be configured according to actual situations.

The transfer assembly 151 of the transfer device 15 is configured to transfer the container C10, and may move the container C10 in both a horizontal direction and a vertical direction.

The transfer assembly 151 may have various configurations. For example, as shown in FIG. 3, the transfer assembly 151 may include a horizontally moving assembly and a vertically moving assembly. The horizontally moving assembly may include a motor D21, a driving screw D22, an internally threaded sleeve D23, an internally threaded sleeve D24, the arm D25, and the like. In the embodiments shown in FIG. 1, the arm D25 of the grip assembly 13 shown in FIG. 3 is connected to the sleeve D24. The horizontally moving assembly is configured to move the container C10 in the horizontal direction. The vertically moving assembly may include a cylinder D26 having a piston rod D27. The piston rod D27 may be fixed to the horizontally moving assembly. For example, the piston rod D27 is fixed to the sleeve D23 of the horizontally moving assembly. The vertically moving assembly is configured to move the container C10 in the vertical direction. Specific connectional configurations of the horizontally moving assembly and the vertically moving assembly may be set according to actual conditions.

As shown in FIG. 3, the conveyer 14 may include: a belt C1, a driving pulley C2, and a pressing force sensor C3. The pressing force sensor C3 is configured to detect a pressing force received by the conveyer 14 in the second station S2. The controller 40 is further configured to determine that the container C10 has been conveyed to the second station S2 when the pressing force detected by the pressing force sensor C3 satisfies a preset pressing force condition, for example when the pressing force detected by the pressing force sensor C3 is greater than or equal to a pressing force threshold value defined by the preset pressing force condition; and control the driving pulley C2 to stop. With provision of the pressing force sensor C3, the conveyer 14 can convey the container with accuracy. A mounting position of the pressing force sensor C3 may be set according to actual conditions. For example, the pressing force sensor C3 may be mounted to a roller of the conveyer, or may be mounted under the belt C1 through a support.

The moving device 16 may move the container C10 in a horizontal direction and a vertical direction. The moving device 16 may have various configurations. For example, as shown in FIG. 1, the moving device 16 may include a driving screw and a step motor. Specifically, the moving device 16 may include a motor E11, a coupling E12, a driving screw E13, an internally threaded sleeve E14, a moving base E15, a connection member E16 and the like. The moving device 16 is connected with the rotary device 10 through the connection member E16, and the moving device 16 is configured to move the rotary device 10 in a horizontal direction. The moving device 16 moves the rotary device 10 between the third station S3 and the fourth station S4 and moves the rotary device 10 between the fourth station S4 and the fifth station S5.

The feeder system according to various embodiments of the present disclosure may further include: a container recovery region F for recovering the container C10 from which the material has been poured. The container recovery region F may be embodied in various manners. For example, the container recovery region F may be a recovery pool, a recovery tank or the like. The container recovery region F may be set according to actual situations.

As shown in FIG. 1, in various embodiments of the present disclosure, the moving device 16 may also move to the fifth station S5, i.e. a recovery station. After the rotary device 10 is moved to the fifth station S5, the rotary device 10 rotates and places the container C10 into the container recovery region F, thereby completing the recovery of the container C10. Specifically, the moving device 16 is further configured to move, in response to a fourth movement instruction sent by the controller 40, the rotary device 10 from the fourth station S4 to the fifth station S5; and the rotary device 10 is further configured to rotate in response to a second rotation instruction sent by the controller 40 and release the container C10 into the container recovery region F, in the fifth station S5.

Referring to FIG. 1 and FIG. 3, in embodiments of the present disclosure, the rotary device 10 includes a carrying member A3 configured to carry the container C10, and a weight sensor A4 is disposed on the carrying member A3. When determining that a weight of remaining material contained in the container C10 is less than a weight threshold value, based on the weight detected by the weight sensor A4, the controller 40 controls the moving device 16 to move the rotary device 10 from the fourth station S4 to the fifth station S5, thereby bringing the container C10 into the container recovery region F. The recovery of the container C10 may also be carried out by means of any other control manner. For example, after a preset period of time since the material begins to be poured from the container C10 fixed to the rotary device 10, the controller 40 controls the moving device 16 to move the rotary device 10 from the fourth station S4 to the fifth station S5. The specific control manner of the recovery of the container may be set according to actual conditions.

In order that the feeder system according to various embodiments of the present disclosure is more clearly understood by those skilled in the art, the feeder system will now be described in detail by means of the following example.

In the example, the feeder system is used to feed ink to a screen of a screen printing apparatus of a display manufacturing system. The specific operational process of the feeder system will be described as below in conjunction with the configuration of the feeder system shown in FIG. 1 to FIG. 3.

An ink tank containing ink is placed on the conveyer 14 in the first station S1. The controller 40 controls the conveyer 14 to operate so that the belt C1 of the conveyer 14 moves the ink tank. When judging that the ink tank has been moved to the second station S2, based on a pressing force detected by the pressing force sensor C3 located near the second station S2, the controller 40 controls the driving pulley C2 of the conveyer 14 to stop so that the ink tank stays in the second station S2.

After determining that the ink tank has stayed in the second station S2, the controller 40 controls the moving device 16 to move the rotary device 10 to the third station S3.

After determining that the ink tank has stayed in the second station S2, the controller 40 controls the grip assembly 13 of the transfer device 15 to grip the ink tank, and controls the transfer assembly 151 to move the ink tank from the second station S2 to the third station S3 and place the ink tank on the rotary device 10. Then, the controller 40 controls the grip assembly 13 of the transfer device 15 to release the ink tank.

After determining that the ink tank has been fixed to the rotary device 10, the controller 40 controls the transfer device 15 to move from the third station S3 to the fourth station S4, and controls the rotary device 10 to rotate in the fourth station S4 to pour the ink contained in the ink tank onto the screen.

After the ink is poured from the ink tank once, the controller 40 controls the rotary device 10 to rotate, so that the ink tank is rotated to a vertical orientation. The controller 40 determines a weight of remaining ink contained in the ink tank, based on a weight detected by the weight sensor A4 mounted to the rotary device 10. When judging that the weight of the remaining ink contained in the ink tank is greater than a preset weight, the controller 40 determines an angle by which the rotary device 10 rotates based on the weight of the remaining ink, and controls the rotary device 10 to rotate by the angle so that the ink is poured from the ink tank once more. When judging that the weight of the remaining ink contained in the ink tank is less than the preset weight, the controller 40 determines that the ink is completely poured from the current ink tank, and then controls the moving device 16 to move the rotary device 10 from the fourth station S4 to the fifth station S5.

After determining that the moving device 16 have moved the rotary device 10 from the fourth station S4 to the fifth station S5, the controller 40 may control the rotary device 10 to rotate by a predetermined angle such as 180 degrees, and controls the grip assembly 13 of the rotary device 10 to release the ink tank into the container recovery region F, thereby completing the recovery of the ink tank.

The controller 40 controls the moving device 16 to move to a preset one of the stations for feeding the ink once again.

The controller 40 is a controller 40 having the above functions, and may be specifically configured according to actual conditions.

In various embodiments of the present disclosure, the controller may be achieved by one or more logic operation processing circuits which may include: a processor such as a central processing unit (CPU), an application specific integrated circuit (ASIC), a digital signal processor (DSP), a field programmable gate array (FPGA), a single-chip microcomputer, and the like.

The feeder system according to various embodiments of the present disclosure can mechanizedly pour the material contained in the container C10, thereby avoiding problems such as lower operational efficiency and material loss caused by manual operation.

With provision of the rotary device 10 and the controller 40, the feeder system according to various embodiments of the present disclosure can mechanizedly pour the material contained in the container C10. Such a mechanized operation consumes less time and has higher operational efficiency. When screen printing is carried out with the feeder system according to various embodiments of the present disclosure, printing time is shortened, working amount of workers is decreased, a waste of the ink is avoided, and environmental safety is guaranteed since whole ink feeding operation is mechanizedly done by the feeder system.

Although some exemplary embodiments of the present disclosure have been shown and described above, it would be appreciated by a person skilled in the art that many modifications or changes may be made therein without departing from the principle and spirit of the present disclosure, the scope of which is defined in the appended claims and their equivalents.

What is claimed is:

1. A feeder system, comprising:
   a rotary device configured to grip a container containing a material;
   a controller electrically connected to the rotary device and configured to send a first rotation instruction to the rotary device so that the rotary device rotates the container,
   wherein the rotary device is configured to rotate by a predetermined angle in response to the first rotation instruction sent by the controller, so that the material in the container is poured;
   a conveyer electrically connected to the controller and configured to convey the container containing the material from a first station to a second station in response to a first movement instruction sent by the controller;
   a transfer device electrically connected to the controller, and configured to transfer the container from the second station to a third station in response to a second movement instruction sent by the controller, thereby to transfer the container to the rotary device; and
   a moving device which is electrically connected to the controller, and to which the rotary device is connected such that the rotary device is moved by the moving device, wherein the moving device is configured to move, in response to a third movement instruction sent by the controller, the rotary device carrying the container from the third station to a fourth station so that the rotary device rotates by the predetermined angle in the fourth station to pour the material contained in the container; or wherein the moving device is configured such that, in response to the third movement instruction sent by the controller, the moving device moves the rotary device from the fourth station to the third station so that the container is fixed to the rotary device, and then the moving device moves the rotary device from the third station to the fourth station so that the rotary device rotates by the predetermined angle in the fourth station to pour the material contained in the container.

2. The feeder system of claim 1, wherein:
   the rotary device comprises:
   a grip assembly configured to grip the container; and
   a rotary assembly to which the grip assembly is connected and which is configured to rotate the grip assembly.

3. The feeder system of claim 2, wherein:
   the rotary assembly comprises a rotary disk to which the grip assembly is connected.

4. The feeder system of claim 3, wherein:
   the rotary assembly further comprises:
   a transmission shaft connected with the rotary disk; and
   a motor connected with the transmission shaft.

5. The feeder system of claim 2, wherein:
   the rotary device further comprises: a carrying member fixedly connected to the rotary assembly and configured to support the container.

6. The feeder system of claim 1, further comprising: a lid opening device configured to open a lid of the container and comprising:
   an opener configured to be attached to the lid of the container; and
   an actuator connected with the opener and configured to move the opener in a direction away from the container so that the lid of the container is opened.

7. The feeder system of claim 1, wherein:
   the rotary device further comprises a weight sensor electrically connected to the controller and configured to detect a weight of the material contained in the container; and
   the controller is further configured to determine, based on the weight detected by the weight sensor, the predetermined angle by which the rotary device needs to rotate, and control the rotary device to rotate by the predetermined angle in a vertical plane.

8. The feeder system of claim 1, wherein: the conveyer comprises:
   an endless belt;
   a driving pulley configured to drive the endless belt to move; and
   a pressing force sensor configured to detect a pressing force received by the belt in the second station; and
   the controller is further configured to determine that the container has been conveyed to the second station when the pressing force detected by the pressing force sensor is greater than a preset pressing force, and control the driving pulley to stop.

9. The feeder system of claim 8, wherein:
   the transfer device comprises:
      a transfer assembly; and
      a grip assembly connected to the transfer assembly and configured to grip the container;
   each of the transfer assembly and the grip assembly is electrically connected to the controller;
   the grip assembly is configured to grip the container in response to the second movement instruction sent by the controller; and
   the transfer assembly is configured to move, in response to the second movement instruction sent by the controller, the grip assembly gripping the container to transfer the container from the second station to the third station.

10. The feeder system of claim 9, wherein: the grip assembly comprises:
   a first gripper formed with a first left-hand threaded hole;
   a second gripper formed with a second right-hand threaded hole;
   a slide rail along which the first gripper and the second gripper are movable; and
   a driving screw having a first left-hand threaded segment engaged in the first left-hand threaded hole of the first gripper, and a second right-hand threaded segment engaged in the second right-hand threaded hole of the second gripper.

11. The feeder system of claim 10, wherein:
   the grip assembly further comprises:
   a first gripping jaw fixed to the first gripper; and
   a second gripping jaw fixed to the second gripper.

12. The feeder system of claim 10, wherein:
   the grip assembly further comprises: a motor which has an output shaft coupled with the driving screw.

13. The feeder system of claim 9, wherein: the transfer assembly comprises:
   a moving assembly to which the grip assembly is connected; and
   an elevating assembly connected with the moving assembly and configured to raise the container after the grip assembly grips the container and to lower the container before the grip assembly releases the container.

14. The feeder system of claim 1, wherein:
   the moving device is further configured to move, in response to a fourth movement instruction sent by the controller, the rotary device from the fourth station to a fifth station; and
   the rotary device is further configured to rotate in response to a second rotation instruction sent by the controller and release the container into a container recovery region, in the fifth station.

15. A feeder system, comprising:
   a rotary device configured to grip a container containing a material; and
   a controller electrically connected to the rotary device and configured to send a first rotation instruction to the rotary device so that the rotary device rotates the container,
   wherein the rotary device is configured to rotate by a predetermined angle in response to the first rotation instruction sent by the controller, so that the material in the container is poured,
   wherein the rotary device comprises:
   a grip assembly configured to grip the container; and
   a rotary assembly to which the grip assembly is connected and which is configured to rotate the grip assembly,
   wherein the grip assembly comprises two grip parts each comprising:
   a pull member having a first end and a second end;
   a pincer having a first end connected with the second end of the pull member, and a second end;
   a gripping member connected to the second end of the pincer; and
   a hinge connected to a middle portion of the pincer.

16. The feeder system of claim 15, wherein:
   the grip assembly further comprises an actuator respectively connected to the first ends of the pull members of the two grip parts to apply pulling forces to the first ends of the pull members, so that the pincers are rotated about axes of rotation of the hinges by the second ends of the pull members of the two grip parts, thereby to grip the container through the gripping members.

17. The feeder system of claim 15, wherein:
   the pull member is a pull rope.

18. The feeder system of claim 15, wherein:
   the rotary assembly comprises a rotary disk to which the grip assembly is connected.

19. A feeder system, comprising:
   a rotary device configured to grip a container containing a material; and
   a controller electrically connected to the rotary device and configured to send a first rotation instruction to the rotary device so that the rotary device rotates the container,
   wherein the rotary device is configured to rotate by a predetermined angle in response to the first rotation instruction sent by the controller, so that the material in the container is poured,
   wherein the rotary device comprises:
   a grip assembly configured to grip the container; and
   a rotary assembly to which the grip assembly is connected and which is configured to rotate the grip assembly,
   wherein the grip assembly comprises:

a first gripper formed with a first left-hand threaded hole;
a second gripper formed with a second right-hand threaded hole;
a slide rail along which the first gripper and the second gripper are movable; and
a driving screw having a first left-hand threaded segment engaged in the first left-hand threaded hole of the first gripper, and a second right-hand threaded segment engaged in the second right-hand threaded hole of the second gripper.

20. The feeder system of claim 19, wherein:
the grip assembly further comprises:
a first gripping jaw fixed to the first gripper; and
a second gripping jaw fixed to the second gripper.

* * * * *